(12) United States Patent
Hadrick et al.

(10) Patent No.: US 12,204,780 B2
(45) Date of Patent: *Jan. 21, 2025

(54) SELF-REFRESH ARBITRATION

(71) Applicant: Micron Technology, Inc., Boise, ID (US)

(72) Inventors: Mark Kalei Hadrick, Boise, ID (US); Yu-Sheng Hsu, San Jose, CA (US); John Christopher Sancon, Boise, ID (US); Kang-Yong Kim, Boise, ID (US); Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

This patent is subject to a terminal disclaimer.

(21) Appl. No.: 17/660,195

(22) Filed: Apr. 21, 2022

(65) Prior Publication Data

US 2023/0342048 A1    Oct. 26, 2023

(51) Int. Cl.
*G06F 3/06* (2006.01)

(52) U.S. Cl.
CPC .......... *G06F 3/0632* (2013.01); *G06F 3/0604* (2013.01); *G06F 3/0679* (2013.01)

(58) Field of Classification Search
CPC ..................................................... G06F 3/0632
USPC .......................................................... 711/166
See application file for complete search history.

(56) References Cited

U.S. PATENT DOCUMENTS

| | | | |
|---|---|---|---|
| 6,965,537 B1 * | 11/2005 | Klein ..................... | G06F 11/106 365/222 |
| 7,139,937 B1 * | 11/2006 | Kilbourne ............. | G11C 11/406 710/110 |
| 9,779,016 B1 * | 10/2017 | Shen ......................... | G06F 1/28 |
| 2006/0087902 A1 * | 4/2006 | Hoehler ............ | G11C 11/40618 365/222 |
| 2006/0206769 A1 * | 9/2006 | Klein ................... | G06F 11/1052 714/E11.05 |

(Continued)

OTHER PUBLICATIONS

"Pursuant to MPEP § 200.16(b) the applicant brings the following co-pending application to the Examiner's attention: U.S. Appl. No. 17/660,192".

(Continued)

*Primary Examiner* — Titus Wong
(74) *Attorney, Agent, or Firm* — Colby Nipper PLLC

(57) ABSTRACT

Described apparatuses and methods relate to self-refresh arbitration. In a memory system with multiple memory components, an arbiter is configured to manage the occurrence of self-refresh operations. In aspects, the arbiter can receive one or more self-refresh request signals from at least one memory controller for authorization to command one or more memory components to enter a self-refresh mode. Upon receiving the one or more self-refresh request signals, the arbiter, based on a predetermined configuration, can transmit one or more self-refresh enable signals to the at least one memory controller with authorization to command the one or more memory components to enter the self-refresh mode. The configuration can ensure that fewer than all memory components simultaneously enter the self-refresh mode. In so doing, memory components can perform self-refresh operations without exceeding an instantaneous power threshold. The arbiter can be included in, for instance, a Compute Express Link™ (CXL™) memory module.

20 Claims, 8 Drawing Sheets

(56) References Cited

U.S. PATENT DOCUMENTS

| | | | | |
|---|---|---|---|---|
| 2008/0037344 | A1* | 2/2008 | Kobayashi | G11C 11/4094 365/201 |
| 2010/0091594 | A1* | 4/2010 | Kobayashi | G11C 8/12 365/201 |
| 2010/0211737 | A1 | 8/2010 | Flynn et al. | |
| 2011/0138251 | A1* | 6/2011 | Pawlowski | G11C 11/40618 714/763 |
| 2011/0138252 | A1* | 6/2011 | Pawlowski | G11C 29/44 714/763 |
| 2012/0195145 | A1* | 8/2012 | Kobayashi | G11C 11/40615 365/200 |
| 2014/0064009 | A1* | 3/2014 | Lee | G11C 11/40615 365/222 |
| 2014/0112087 | A1* | 4/2014 | Klein | G11C 11/40626 365/222 |
| 2015/0009737 | A1* | 1/2015 | Stephens, Jr. | G11C 5/06 365/51 |
| 2016/0350002 | A1* | 12/2016 | Vergis | G11C 11/40615 |
| 2018/0025771 | A1* | 1/2018 | Bains | G11C 11/40615 365/222 |
| 2019/0138234 | A1* | 5/2019 | Brandl | G06F 3/0604 |
| 2019/0189194 | A1* | 6/2019 | Kim | G11C 5/148 |
| 2020/0075087 | A1* | 3/2020 | Vankayala | G06F 3/0673 |
| 2021/0020224 | A1* | 1/2021 | Cox | G11C 11/4074 |
| 2021/0026789 | A1 | 1/2021 | Cheng et al. | |
| 2021/0157494 | A1* | 5/2021 | Schaefer | G06F 3/0616 |
| 2023/0289226 | A1 | 9/2023 | Segev et al. | |
| 2023/0305922 | A1 | 9/2023 | Frey et al. | |
| 2023/0342047 | A1 | 10/2023 | Hadick et al. | |

OTHER PUBLICATIONS

"Introducing the Compute Express Link 2.0 Specification", https://www.computeexpresslink.org/_files/ugd/0c1418_845869a5a6f54037a028b1c44b334471.pdf, Dec. 2020, 21 pages.

"Non-Final Office Action", U.S. Appl. No. 17/660,192, filed Dec. 15, 2023, 28 pages.

"Advisory Action", U.S. Appl. No. 17/660,192, filed Nov. 19, 2024, 3 pages.

"Final Office Action", U.S. Appl. No. 17/660,192, filed Aug. 19, 2024, 10 pages.

* cited by examiner

700

Receive a first signal indicative of a request from at least one memory controller for authorization to command at least one memory component to enter a self-refresh mode
702

Transmit a second signal that authorizes the at least one memory controller to command the at least one memory component to enter the self-refresh mode based on the first signal
704

SELF-REFRESH ARBITRATION

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and nonvolatile memory (e.g., flash memory). Like the number of cores or speed of a processor, the rate at which data can be accessed and the delays in accessing it can impact an electronic device's performance. Memory demands in electronic devices continue to evolve and grow. For example, as manufacturers design processors to execute code faster, processors benefit from accessing data in memories more quickly. Applications on electronic devices may also operate on ever-larger data sets that require ever-larger memories.

BRIEF DESCRIPTION OF THE DRAWINGS

Apparatuses of and techniques for self-refresh arbitration are described with reference to the following drawings. The same numbers are used throughout the drawings to reference like features and components:

FIG. 7 is a flow diagram illustrating example processes for an arbiter in accordance with aspects of self-refresh arbitration.

DETAILED DESCRIPTION

Overview

Figure 1:
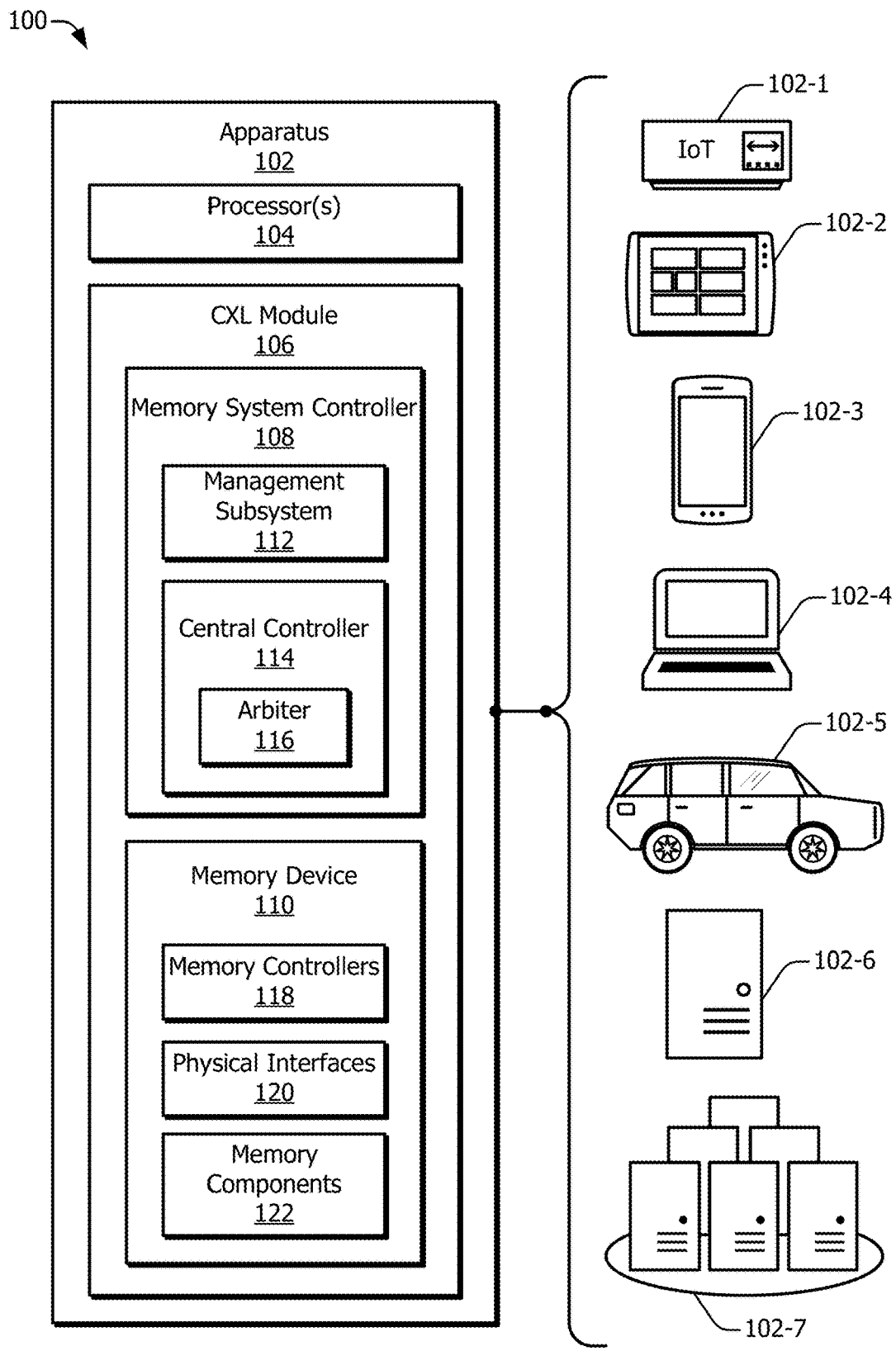
FIG. 1 illustrates example apparatuses that can implement self-refresh arbitration.

Processors and memory work in tandem to provide features on computers and other electronic devices, including smartphones. An electronic device can generally provide enhanced features, such as high-resolution graphics and artificial intelligence, as a processor-and-memory tandem operate faster. Some applications, like those for artificial intelligence and virtual-reality graphics, demand increasing amounts of memory. Advances in processors have often outpaced those for memories or the connections between the processor and memory. For these reasons, memory may create a bottleneck to further computing improvements even as processors become faster.

Processors and memories can be secured to a printed circuit board (PCB), such as a motherboard. The PCB can include sockets for accepting at least one processor and one or more memories and can support various wiring infrastructure that enables communication between two or more components. A PCB, however, offers a finite area for the sockets and the wiring infrastructure. Some PCBs include sockets that are shaped into linear slots and are designed to accept several double-inline memory modules (DIMMs). These sockets can be fully occupied by DIMMs while a processor is still able to utilize more memory. In such situations, the system would have improved performance if more memory were available to the processor.

Printed circuit boards may also include at least one peripheral component interconnect (PCI) express (PCI Express®) (PCIe®) slot. PCIe is designed to provide a common interface for various types of components that may be coupled to a PCB. Compared to some older standards, PCIe can provide higher rates of data transfer or a smaller footprint on the PCB, including both greater speed and smaller size. PCIe links enable the interconnection of processors and peripheral memory devices at increased speeds compared to older standards. Accordingly, some PCBs enable a processor to access a memory device that is connected to the PCB via a PCIe slot.

PCIe links, however, have limitations in, for example, environments with large, shared memory pools and devices that require high bandwidth and low latency. For example, PCIe links do not specify mechanisms to support coherency and often cannot efficiently manage isolated pools of memory. In addition, the latency for PCIe links can be too high to efficiently manage shared memory access across multiple devices within a system.

As a result, accessing a memory solely using a PCIe protocol may not offer as much functionality, flexibility, or reliability as is desired. In such cases, another protocol can be layered on top of the PCIe protocol. An example of another, higher-level protocol is the Compute Express Link™ (CXL™) protocol or standard (referred to hereinafter as "the CXL protocol" or "the CXL standard"). The CXL protocol can be implemented over a physical layer that is governed by, for instance, the PCIe protocol. The CXL protocol targets intensive workloads for processors and memory devices (e.g., accelerators, memory expanders), where efficient, coherent memory access or interactions between processors and memory is beneficial.

The CXL protocol addresses some of the limitations of PCIe links by providing an interface that leverages the PCIe (e.g., the PCIe 5.0) physical layer and electricals, while providing lower-latency paths for memory access and coherent caching between processors and memory devices. It offers high-bandwidth, low-latency connectivity between host devices (e.g., processors, CPUs, SoCs) and memory devices (e.g., accelerators, memory expanders, memory buffers, smart input/output (I/O) devices). The CXL protocol also addresses growing high-performance computational workloads by supporting heterogeneous processing and memory systems with potential applications in artificial intelligence, machine learning, communication systems, and other high-performance computing.

Various electronic devices, such as a mobile phone with a system-on-chip (SoC) or a cloud-computing server with dozens of processing units, may employ memory that is coupled to a processor via a CXL-based interconnect (which can be referred to as a "CXL link" in this document). For clarity, consider an apparatus with a host device that is coupled to a memory device via a CXL link. The host device can include a processor and a controller (e.g., a host-side controller) that is coupled to the interconnect. The memory device can include another controller (e.g., a memory-side controller) that is coupled to the interconnect and one or more memory arrays to store information in static RAM (SRAM), dynamic RAM (DRAM), flash memory, and so forth.

In aspects, a PCB having components that can comport with or implement the CXL protocol is referred to herein as a CXL module. The CXL module may include a memory system controller and one or more memory devices connected thereto. A memory device may include memory components with volatile memory, including dynamic random-access memory (DRAM), double data rate synchronous DRAM (DDR SDRAM), low-power DDR (LPDDR) SDRAM, and so forth. DRAM-based memory components may include memory cells that are individually composed of a transistor (e.g., a metal-oxide-semiconductor (MOS) field-effect transistor (FET) (MOSFET)) and a capacitor (e.g., a capacitor integrated into a chip) with each memory cell configured to store a data bit (e.g., one instance of binary data). A capacitor in a memory cell may be configured to hold an electrical charge for only, e.g., a few milliseconds due to charge leakage.

As a result, in order to maintain the data integrity of such volatile memory cells, capacitors may be periodically refreshed using a current from a power supply (e.g., a power management integrated circuit (PMIC)). Refresh operations may be initiated and controlled by a memory controller that is external to a chip or die including the memory component (e.g., using an auto-refresh command issued by the memory controller) or by a refresh controller that is internal to the memory chip or die (e.g., using a self-refresh operation controlled by the refresh controller). A self-refresh operation may further involve deactivating an internal clock to reduce power consumption and executing a refresh operation by using an internal refresh counter.

In example implementations, the CXL module can have one or more channels. Each channel can include at least a portion of one or more memory devices having any number of memory components that are communicatively coupled to the memory system controller via one or more memory controllers. For example, a CXL module includes three channels. Each of the three channels can include at least a portion of at least one memory device. The portion may include, for example, 40 memory components that are communicatively coupled to a memory system controller of the CXL module. In total, allocated between the three channels, 120 memory components of the at least one memory device may be communicatively coupled to the memory system controller via one or more memory controllers. Each memory controller may operate one or more memory components.

The computing device may perform memory input/output training to ensure appropriate signaling and timing between the memory components and respective memory controllers. The memory input/output training can include an iterative testing of different I/O (input/output) interface parameters with the memory controllers and associated physical-layer circuitries to determine and implement settings that result in accurate signaling on signal lines to and from the memory components. Memory input/output training may involve, on a die level, establishing appropriate signal timing between, for example, an internal clock and a data clock, a data clock and data, the internal clock and a command address, and so forth. As an example, the computing device can perform memory input/output training to train a command bus timing and voltage sampling point to be in a center of a signal eye (e.g., for greater signal accuracy) for improved communication performance. Memory input/output training can be a power-hungry operation, drawing large currents and consuming large amounts of power.

In an aspect, during memory input/output training, memory controllers may instruct memory components to enter a self-refresh mode to preserve the data integrity of the memory components, to lower steady-state power usage, and/or to facilitate a memory controller's interaction with other components for the input/output training. In an example, entering a self-refresh mode to perform a self-refresh operation may involve memory components of one or more channels activating banks (e.g., logical units of a memory array), which are also referred to as memory banks. For instance, absent implementation of the techniques described herein, 120 memory components across the three memory channels may each simultaneously activate banks during self-refresh operations that happen to start concurrently while memory input/output training is occurring. Bank activation by multiple memory components, such as those within more than one channel, can result in high-instantaneous current draw and power consumption. In such a scenario, a power distribution network of the CXL module can be overwhelmed, causing a voltage supply drop and a ground bounce. This voltage fluctuation may adversely impact the memory input/output training, as well as the overall performance of the computing device.

To prevent, or at least reduce, such voltage fluctuations and simultaneously improve performance of a C×L system or other memory device with multiple memory components, this document describes apparatuses of and techniques for self-refresh arbitration. In aspects, an arbiter can be configured to receive one or more self-refresh request signals from memory controllers. The arbiter can then selectively provide one or more self-refresh enable signals to different portions or sets of the memory controllers in such a way that self-refresh operations can be performed without exceeding an instantaneous power threshold. For example, the arbiter can transmit the self-refresh enable signals to the different memory channels using a round robin scheme. As a result, the arbiter can manage a timing of the self-refresh operations across the multiple memory components on a per-channel basis, improving memory input/output training and overall system performance.

As an example, multiple memory controllers of a given channel are operably interfaced to multiple memory components. The multiple memory controllers can transmit a first signal indicating a request for authorization to command one or more of the multiple memory components to enter a self-refresh mode. A logical OR gate can receive as input the first signal from each of the multiple memory controllers and output a second signal to an arbiter. Thus, if at least one memory controller of the multiple memory controllers requests authorization, the OR gate indicates to the arbiter that the given channel has memory components that are "ready" to enter the self-refresh mode. Another OR gate associated with another channel can provide another second signal to the arbiter. The arbiter can use a third signal to authorize the multiple memory controllers of a selected channel to command the one or more memory components of that channel to enter the self-refresh mode based on the received second signals from multiple OR gates. In some configurations, the arbiter provides authorization using a round-robin scheme that can consider an order of arrival of active or affirmative second signals or an order of priority between two or more memory channels.

Example Operating Environments

FIG. 1 illustrates, at 100 generally, an example apparatus 102 that can implement an arbiter directed at managing self-refresh operations in accordance with some implementations. The apparatus 102 can include various types of computing devices, including an internet-of-things (IoT) device 102-1, a tablet device 102-2, a smartphone 102-3, a notebook computer 102-4, a passenger vehicle 102-5, a server computer 102-6, and a server cluster 102-7 that may be part of cloud computing infrastructure or a data center or a portion thereof (e.g., PCB). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus 102 can include one or more components to provide computing functionalities or features.

In example implementations, the apparatus 102 can include one or more processors 104 and at least one CXL module 106 having a memory system controller 108 and at least one memory device 110. The processor(s) 104 may include a general-purpose processor, a central processing unit (CPU), a graphics processing unit (GPU), a neural network engine or accelerator, an application-specific integrated circuit (ASIC), a field-programmable gate array (FPGA), integrated circuit (IC), or a communications processor (e.g., a modem or baseband processor). In implementations, the processor(s) 104 may be implemented within, or substituted with, a host device (e.g., a system-on-a-chip (SoC)).

In some cases, a single processor can comprise multiple processing resources, each dedicated to different functions (e.g., modem management, applications, graphics, central processing). In some implementations, a baseband processor may include or be coupled to a modem and referred to as a modem processor. The modem or the baseband processor may be coupled wirelessly to a network via, for example, cellular, Wi-Fi®, Bluetooth®, near field, or another technology or protocol for wireless communication. In some implementations, the processor(s) 104 may be connected directly to the memory device 110 (e.g., via an interconnect). In other implementations, one or more of the processor(s) 104 may be indirectly connected to the memory device 110 (e.g., over a network connection or through one or more other devices). The memory device 110 may be implemented as a Type 1 CXL device, a Type 2 CXL device, or a Type 3 CXL device.

The memory system controller 108 may include at least one management subsystem 112 and at least one central controller 114. The management subsystem 112 can include, for instance, a power management chip configured to distribute, or in some implementations supply, electrical power. The central controller 114 can include, for example, at least one arbiter 116 and other logic circuitry (not illustrated). The arbiter 116 may be implemented as a logic circuit configured to allocate access to shared resources. For example, the arbiter 116 can receive as input "N" number of input signals (e.g., self-refresh request signals) and output a signal (e.g., a self-refresh enable signal), as an active or asserted (e.g., logic one or high voltage) signal, to one or more components. The arbiter 116 can be implemented as an asynchronous arbiter, a round-robin arbiter (RAA), a priority arbiter, or any other type of arbiter. For example, if implemented as a priority arbiter, the arbiter 116 can be configured to give priority when outputting a signal based on a number of factors, including a request time, a source of a request, and so forth. Further, the arbiter 116 may be implemented as any of a variety and/or combination of latches, flip-flops, or logic gates, as a finite state machine, and so forth. In aspects, the arbiter 116 is configured to manage self-refresh operations.

The memory device 110, which can also be implemented as at least one memory module, can include one or more memory controllers 118, one or more physical interfaces 120, and one or more memory components 122. The memory controllers 118 may be general-purpose controllers implemented as digital circuitry that can be operably coupled to one or more memory components 122 through physical interfaces 120. The memory controllers 118 and the memory components 122 (e.g., one or more DRAM dies, such as LPDDR memory devices/modules) can be compliant with any of a variety of standards or specifications. As an example, the memory controllers 118 can be implemented as Low-Power Double Data Rate 5 (LPDDR5) memory controllers 118 ("LP5 memory controllers") operably coupled to memory components 122 via one or more physical interfaces 120.

The memory controllers 118, in some configurations, can be implemented as integrated memory controllers (IMCs), a memory chip controller (MCC), or a memory controller unit (MCU). In addition, the memory controllers 118 may contain logic configured to implement read and write functions with memory components 122 (e.g., DRAM). Further, memory controllers 118 may contain logic configured to request (e.g., generate and transmit a signal to) an arbiter 116 for authorization to command the memory components 122 to enter a self-refresh mode in order to be refreshed without contemporaneous input or control by the memory controllers 118. Refreshing memory components 122 can maintain data integrity, and such refreshing may involve reading information from an area of computer memory (e.g., a word line) and immediately rewriting the read information to the same area without modification. This reading and rewriting can restore an electric charge of one or more capacitors that represent bit values within the memory components 122. A memory controller (e.g., one of the memory controllers 118) may be configured to control one or more memory components 122 through a physical interface (e.g., one or more of the physical interfaces 120). For example, a single memory controller may be connected to four memory components 122 through a single physical interface chip or other circuit.

The memory controllers 118 may further include, or be coupled to, control circuitry (not illustrated). The control circuitry may include various circuit components, including logic gates, capacitors, resistors, transistors, and the like. Operations implemented by the control circuitry can include communicating with other devices, managing memory performance, and performing memory read or write operations. In some cases, such control circuitry may be included as part of a die having at least one memory array for the memory components 122. For example, the control circuitry can include one or more registers, at least one instance of array control logic, and clock circuitry. The registers may be implemented, for example, as one or more registers (e.g., a self-refresh mode enablement register) that can store information to be used by the control circuitry or another part of the memory device 110.

The physical interfaces 120 can include routing, wiring, busing, and the like, enabling communications between the memory controllers 118 and the memory components 122. In some implementations, the physical interfaces 120 may include logic to facilitate communication with the memory components on an analog signaling level across the electrical routing. The physical interfaces 120 may be realized as, for example, one or more IC chips that perform memory input/output training with the one or more memory components. The physical interfaces 120 can be configured to determine a frequency or interval in which to perform memory input/output training. For example, the physical interfaces 120 may initiate a memory input/output training sequence at system initialization, to determine settings and establish communications between the memory controllers 118 and the memory components 122.

The memory components 122 may be implemented as, for example, a dynamic random-access memory (DRAM) die or module (e.g., Low-Power Double Data Rate synchronous DRAM (LPDDR SDRAM)) or portion thereof. The DRAM die or module can include a three-dimensional (3D) stacked DRAM device, which may be a high-bandwidth memory (HBM) device or a hybrid memory cube (HMC) device. The memory device 110 can operate as a main memory for the apparatus 102. In some implementations, a CXL module 106 of an apparatus 102 may include more than one memory device 110. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™). The memory components may, however, include other types of memory, such as static random-access memory (SRAM).

The processor(s) 104 may be operably coupled via an interconnect (not illustrated) to the CXL module 106, including to the memory device 110. In some examples, the memory device 110 is connected to the processor(s) 104 via the interconnect with an intervening buffer or cache. The memory device 110 may operatively couple to storage memory (not shown). The processor(s) 104 can also be coupled, directly or indirectly via the interconnect, to the memory device 110 and the storage memory. The interconnect, as well as other interconnects not illustrated in FIG. 1, can transfer data between two or more components of the apparatus 102. Examples of the interconnect include a bus, switching fabric, or one or more wires that carry voltage or current signals.

The apparatus 102 may also include one or more interconnects that are internal to the CXL module 106. In accordance with some memory standards, the interconnect(s) can include at least one command and address bus (CA bus) and at least one data bus (DQ bus). Each bus may be a unidirectional or a bidirectional bus. The CA bus and the DQ bus may couple to CA and DQ pins, respectively, of the memory device 110. In some implementations, the interconnect (e.g., if coupled between the memory controllers 118 and the memory components 122) may also include a chip-select (CS) I/O (not illustrated in FIG. 1) that can, for example, couple to one or more CS pins of the memory device 110. The interconnect may also include a clock bus that is part of or separate from the CA bus.

An interconnect coupling the processor(s) 104 to the CXL module 106 can include or be realized using a CXL link. In other words, the interconnect can comport with at least one CXL standard or protocol. The CXL link can provide an interface on top of the physical interface and electricals of, e.g., the PCIe 5.0 physical interface. The CXL link can cause requests to and responses from the CXL module 106 to be packaged as flits. In other implementations, the interconnect can be another type of link, including a PCIe 5.0 link. In this document, some terminology may draw from one or more of these memory standards or versions thereof, like the CXL standard or the LPDDR5 standard, for clarity. The described principles, however, are also applicable to memories and systems that comport with other standards and types of interconnects.

The apparatus 102 can be implemented in various manners with more, fewer, or different components. For example, the processor(s) 104 may be implemented within one or more host devices or include multiple cache memories (e.g., including multiple levels of cache memory) or no cache memory. A memory (e.g., the CXL module 106 or the memory device 110) may have an "internal" or "local" cache memory. As another example, the apparatus 102 may include cache memory between an interconnect and the memory device 110. Computer engineers can also include the illustrated components in distributed or shared memory systems.

Computer engineers may implement the processor(s) 104, CXL module 106, and the various memory devices 110 in multiple manners. In some implementations, one or more of the processor(s) 104 and the memory device 110 can be disposed on, or physically supported by, a common PCB (e.g., a rigid or flexible motherboard) that omits a CXL module 106. In other implementations, the processor(s) 104, the CXL module 106, and/or the memory device 110 may additionally be integrated on an IC or fabricated on separate ICs and packaged together. A memory device 110 may also be coupled to multiple processors 104 via one or more interconnects and may respond to memory requests from two or more processors 104. In addition, the apparatus 102 may include multiple memory devices 110 that are part of a CXL module 106 or that are independent of a CXL module 106.

This document describes an example computing system architecture with a CXL module 106 having a memory system controller 108 with an arbiter 116 operably coupled to the memory device 110 having memory components 122. The memory device 110 includes memory components 122, which may include multiple memory banks (e.g., as part of one or as distributed across multiple modules, dies, banks, or bank groups) that are not illustrated in FIG. 1. As a non-limiting example, a memory component 122 may include one to sixteen banks. The multiple memory banks can be powered via a shared power distribution network. The memory device 110 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM). The memory device 110 can form at least part of the main memory of the apparatus 102. The memory device 110 may, however, form at least part of a cache memory, a storage memory, or an SoC of the apparatus 102.

Figure 2:
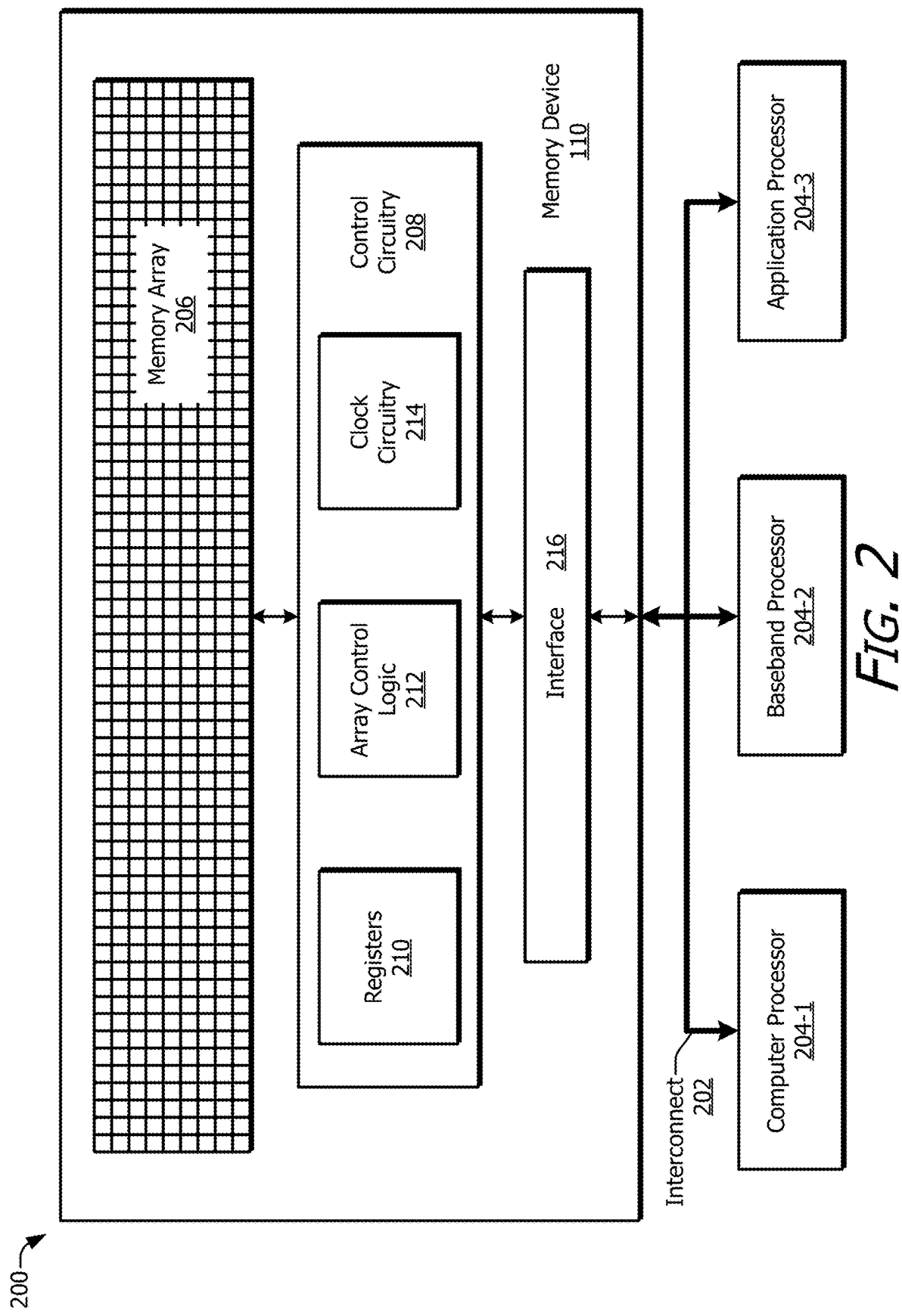
FIG. 2 illustrates an example computing system that can implement aspects of self-refresh arbitration with a memory device.

FIG. 2 illustrates an example computing system 200 that can implement aspects of self-refresh arbitration in a memory device in accordance with some implementations. As illustrated, the computing system 200 includes at least one memory device 110, at least one interconnect 202, and at least one processor 204 (e.g., processor(s) 104).

The memory device 110 can include, or be associated with, at least one memory array 206 and control circuitry 208 operatively coupled to the memory array 206. The memory device 110 can correspond to one or more of cache memory, main memory, or storage memory. Thus, the memory array 206 can include an array of memory cells, including but not limited to memory cells of DRAM, SDRAM, 3D-stacked DRAM, DDR memory, low-power DRAM, or LPDDR SDRAM. For example, the memory array 206 can include memory cells of SDRAM configured as a memory module with one channel containing either 16 or 8 data (DQ) signals, with double-data-rate input/output (I/O) signaling, and supporting a supply voltage of 0.3 to 0.5V. The density of the memory device 110 can range, for instance, from 2 Gb to 32 Gb, but other sizes may be used. The memory array 206 and the control circuitry 208 may be components on a single semiconductor die or on separate semiconductor dies. The memory array 206 or the control circuitry 208 may also be distributed across multiple dies.

The control circuitry 208 can include various components that the memory device 110 can use to perform various operations. These operations can include communicating with other devices, managing memory performance, and so forth. The control circuitry 208 can include one or more registers 210, at least one instance of array control logic 212, and clock circuitry 214. The registers 210 may be implemented, for example, as one or more registers (e.g., a self-refresh mode enablement register) that can store information to be used by the control circuitry 208 or another part of the memory device 110. The array control logic 212 can be circuitry that provides command decoding, address decoding, input/output functions, amplification circuitry, power supply management, power control modes, and other functions. The clock circuitry 214 can synchronize various memory components with one or more external clock signals provided over the interconnect 202, including a command/address clock or a data clock. The clock circuitry 214 can also use an internal clock signal to synchronize memory components.

The interface 216 can couple the control circuitry 208 or the memory array 206 directly or indirectly to the interconnect 202. As shown in FIG. 2, the registers 210, the array control logic 212, and the clock circuitry 214 can be part of a single component (e.g., the control circuitry 208). In other implementations, one or more of the registers 210, the array control logic 212, or the clock circuitry 214 may be separate components on a single semiconductor die or distributed across multiple semiconductor dies. These components may individually or jointly couple to the interconnect 202 via the interface 216.

The interconnect 202 may realize or include one or more of a variety of interconnects that communicatively couple together various components and enable commands, addresses, or other information and data to be transferred between two or more components (e.g., between the memory device 110 and a processor 204). Although the interconnect 202 is illustrated with a single line in FIG. 2, the interconnect 202 may include at least one bus, at least one switching fabric, one or more wires or traces that carry voltage or current signals, at least one switch, one or more buffers, and so forth. Further, the interconnect 202 may be separated into at least a CA bus and a DQ bus. Additionally or alternatively, the interconnect 202 can implement a CXL link or comport with at least one CXL standard. The CXL link can provide an interface on top of the physical layer and electricals of, e.g., a PCIe 5.0 physical layer.

In some aspects, the memory device 110 may be a "separate" component relative to the processor(s) 104 (of FIG. 1), the CXL module 106, or any of the processors 204. The separate components can include a PCB, memory card, memory stick, or memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 110 may be included or integrated with other physical components, including a host device or the CXL module 106, by being combined on a PCB or in a single package or an SoC or by being included together within a single enclosure.

In some cases, the described apparatuses and methods may be appropriate for memory designed for lower-power operations or energy-efficient applications. An example of a memory standard related to low-power applications is the LPDDR standard for SDRAM as promulgated by the JEDEC Solid State Technology Association. In this document, some terminology may draw from one or more of these standards or versions thereof, like the LPDDR5 standard, for clarity. The described principles, however, are also applicable to memories that comport with other standards, including other LPDDR standards (e.g., earlier versions or future versions like LPDDR6) and to memories that do not adhere to a public standard.

As shown in FIG. 2, the processors 204 may include a computer processor 204-1, a baseband processor 204-2, or an application processor 204-3 that is (are) coupled to the memory device 110 through the interconnect 202. The processors 204 may include or form a part of a CPU, GPU, SoC, ASIC, or FPGA. In some cases, a single processor can comprise multiple processing resources, each dedicated to different functions (e.g., modem management, applications, graphics, central processing). In some implementations, the baseband processor 204-2 may include or be coupled to a modem (not illustrated in FIG. 2) and referred to as a modem processor. The modem or the baseband processor 204-2 may be coupled wirelessly to a network via, for example, cellular, Wi-Fi®, Bluetooth®, near field, or another technology or protocol for wireless communication.

In some implementations, the processors 204 may be connected directly to the memory device 110 (e.g., via the interconnect 202). In other implementations, one or more of the processors 204 may be indirectly connected to the memory device 110 (e.g., over a network connection or through one or more other devices). Further, the processors 204 may be realized similar to the processor(s) 104 of FIG. 1.

Example Techniques and Hardware

Figure 3:
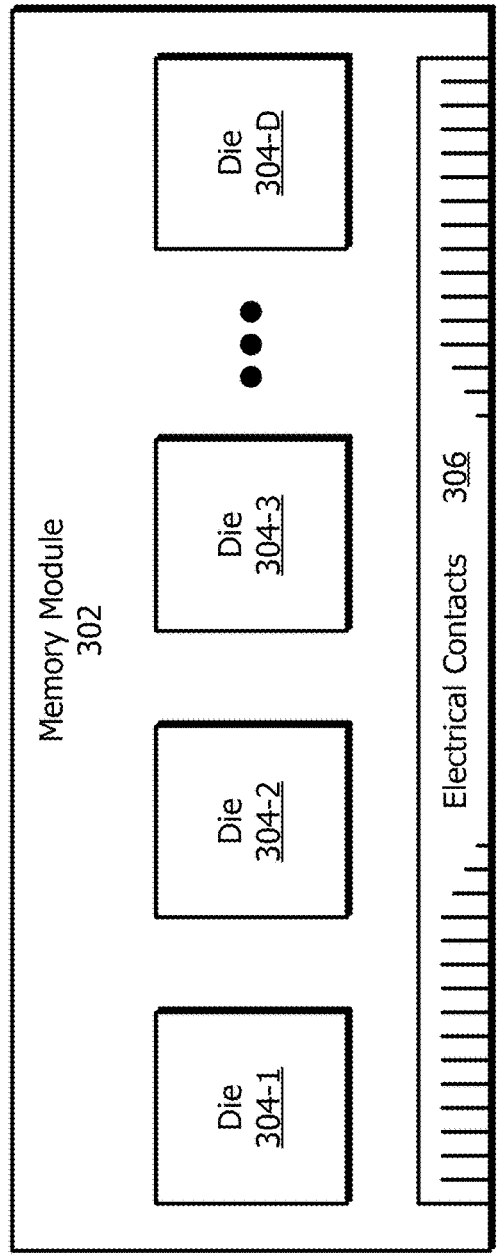
FIG. 3 illustrates an example memory device that can implement aspects of self-refresh arbitration.

FIG. 3 illustrates an example memory device 300 in accordance with some implementations. An example memory module 302 includes multiple dies 304. As illustrated, the memory module 302 includes a first die 304-1, a second die 304-2, a third die 304-3, and a $D^{th}$ die 304-D, with "D" representing a positive integer. As a few examples, the memory module 302 can be a SIMM or a DIMM. As another example, the memory module 302 can interface with other components via a bus interconnect (e.g., a PCIe bus). The memory device 110 illustrated in FIGS. 1 and 2 can correspond, for example, to a single die 304, multiple dies 304-1 through 304-D, or a memory module 302 with at least one die 304. As shown, the memory module 302 can include one or more electrical contacts 306 (e.g., pins) to interface the memory module 302 to other components.

The memory module 302 can be implemented in various manners. For example, the memory module 302 may include a PCB, and the multiple dies 304-1 through 304-D may be mounted or otherwise attached to the PCB. The dies 304 (e.g., memory dies) may be arranged in a line or along two or more dimensions (e.g., forming a grid or array). The dies 304 may have a similar size or may have different sizes. Each die 304 may be similar to another die 304 or unique in size, shape, data capacity, or control circuitries. The dies 304 may also be positioned on a single side or on multiple sides of the memory module 302.

Figure 4:
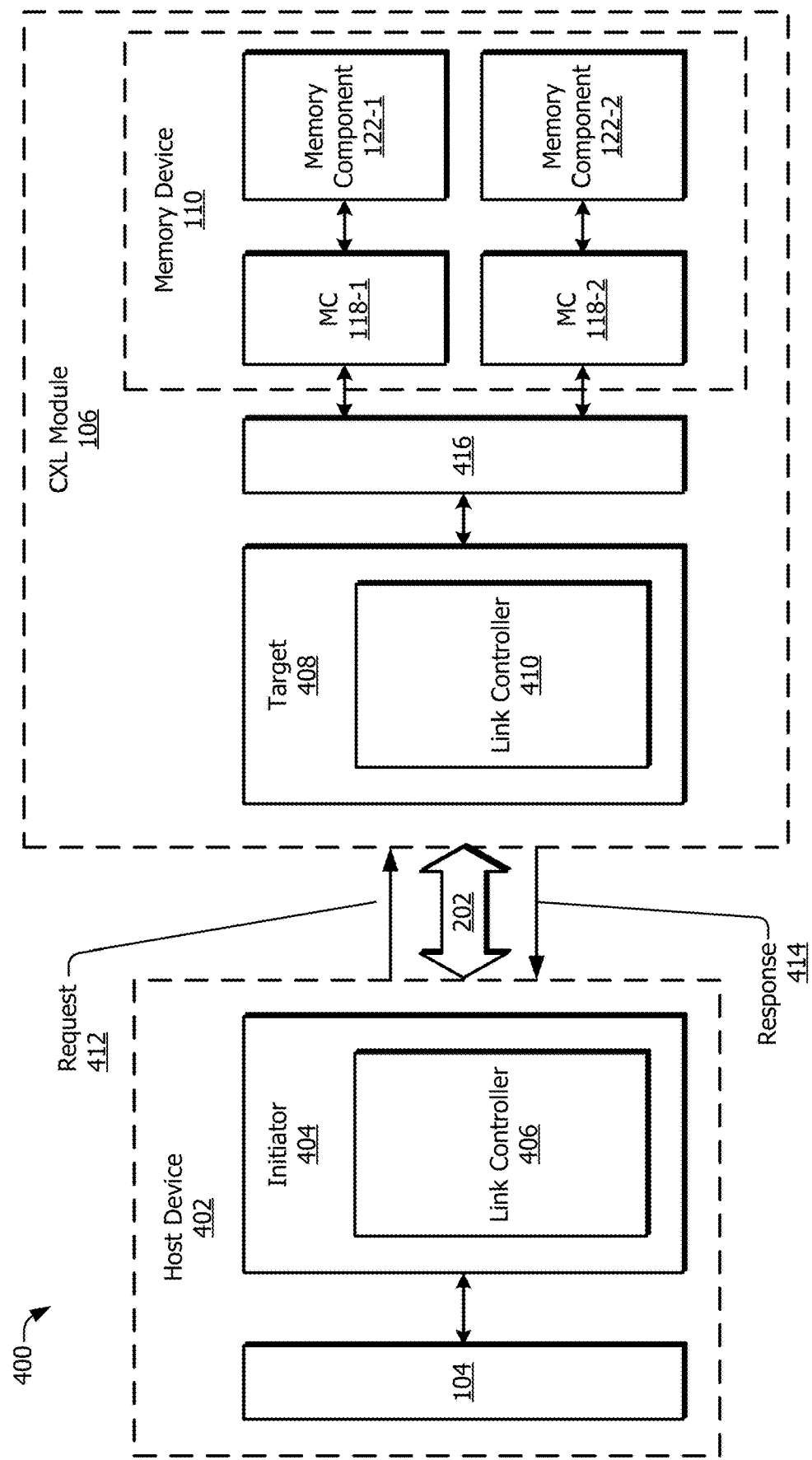
FIG. 4 illustrates an example of an apparatus that can implement aspects of self-refresh arbitration and that includes a host device and a memory device coupled together via an interconnect.

FIG. 4 illustrates an example of a system 400 that includes a host device 402 and a CXL module 106 having the memory device 110 in accordance with some implementations. The host device 402 and the CXL module 106 are coupled together via an interconnect 202. The system 400 may form at least part of an apparatus 102 as shown in FIG. 1. As illustrated in FIG. 4, the host device 402 includes processor(s) 104 and an initiator 404 having a link controller 406. The initiator 404 can be coupled to the processor(s) 104 or to the interconnect 202 (including to both), and the initiator 404 can be coupled between the processor(s) 104 and the interconnect 202. Examples of initiators 404 may include a leader, a primary, a master, a main component, and so forth.

In the illustrated example system 400, the CXL module 106 includes the memory device 110 and a target 408 with a link controller 410. The target 408 can be coupled to the interconnect 202. Thus, the target 408 and the initiator 404 can be coupled to each other via the interconnect 202. Examples of targets 408 may include a follower, a secondary, a slave, a responding component, and so forth. The target 408 may be part of the memory system controller 108 and thus interoperate with the management subsystem 112 or the central controller 114 (each of FIG. 1). The memory device 110 also includes one or more memory components 122, which may be realized with at least one memory module, such as a DRAM, as is described further below.

In example implementations, the initiator 404 includes the link controller 406, and the target 408 includes the link controller 410. The link controller 406 or the link controller 410 can instigate, coordinate, cause, or otherwise control signaling across a physical or logical link realized by the interconnect 202 in accordance with one or more protocols. The link controller 406 may be coupled to the interconnect 202. The link controller 410 may also be coupled to the interconnect 202. Thus, the link controller 406 can be coupled to the link controller 410 via the interconnect 202. Each link controller 406 or 410 may, for instance, control communications over the interconnect 202 at a link layer or at one or more other layers of a given protocol. Communication signaling may include, for example, a request 412 (e.g., a write request or a read request), a response 414 (e.g., a write response or a read response), and so forth.

In addition to the memory device 110 and the target 408, the CXL module 106 may further include at least one interconnect 416. The memory device may further include at least one memory controller 118 (e.g., MC 118-1, MC 118-2). Within the CXL module 106, and relative to the target 408, the interconnect 416, the at least one memory controller 118, and/or the memory components 122 may be referred to as a "backend" component of the memory device 110. In some cases, the interconnect 416 is located at least partly internal to the memory device 110 and may operate the same as or differently from the interconnect 202.

As shown, the memory device 110 may include multiple memory controllers 118-1 and 118-2 and/or multiple memory components 122-1 and 122-2. Although only two memory controllers 118 and two memory components 122 are illustrated, the memory device 110 may include more (or fewer) than two memory controllers and/or more (or fewer) than two memory components. For example, a memory device 110 may include four memory controllers and 16 DRAMs, such as four DRAMs per memory controller. The memory components 122 of the memory device 110 are described as DRAM as an example only, for one or more of the memory components 122 may be implemented as another type of memory. For instance, the memory components 122 may include nonvolatile memory like flash or PCM. Alternatively, the memory components 122 may include other types of volatile memory like SRAM. A memory device 110 may also include any combination of memory types.

In some cases, the CXL module 106 may include the target 408, the interconnect 416, the at least one memory controller 118, and the at least one memory component 122 (as well as the memory system controller 108 of FIG. 1) within a single housing or other enclosure. The enclosure, however, may be omitted or may be merged with an enclosure for the host device 402, the system 400, or an apparatus 102 (of FIG. 1). In some cases, each of these components can be realized with a separate IC. In some of such cases, the interconnect 416 can be disposed on a PCB and/or the CXL module 106. Each of the target 408, the memory controller 118, and the at least one memory component 122 may be fabricated on at least one IC and packaged together or separately. The packaged ICs may be secured to or otherwise supported by the PCB and may be directly or indirectly coupled to the interconnect 416. In other cases, the target 408, the interconnect 416, and the one or more memory controllers 118 may be integrated together into one IC. In some of such cases, this IC may be coupled to a PCB or CXL module 106, and one or more modules for the memory components 122 may also be coupled to the same PCB, which can form a CXL memory device. This memory device may be enclosed within a housing or may include such a housing. The components of the CXL module 106 or other memory device may, however, be fabricated, packaged, combined, and/or housed in other manners.

As illustrated in FIG. 4, the target 408, including the link controller 410 thereof, can be coupled to the interconnect 416. Each memory controller 118 of the multiple memory controllers 118-1 and 118-2 can also be coupled to the interconnect 416. Accordingly, the target 408 and each memory controller 118 of the multiple memory controllers 118-1 and 118-2 can communicate with each other via the interconnect 416. Each memory controller 118 is coupled to at least one memory component 122. Each memory controller 118 of the multiple memory controllers 118-1 and 118-2 may, however, be coupled to a respective set of multiple memory components 122 (e.g., to two, four, five or more memory components 122).

Each memory controller 118 can access at least one memory component 122. The multiple memory controllers 118-1 and 118-2 and the multiple memory components 122-1 and 122-2 can be organized in many different manners. For example, each memory controller 118 can realize at least part of one or more memory channels for accessing the memory components 122. Further, the memory components 122 can be manufactured to include one or more ranks, such as a single-rank or a dual-rank memory module. Each memory component 122 (e.g., at least one DRAM IC chip) may also include multiple banks, such as 8 or 16 banks.

The system 400, the initiator 404 of the host device 402, or the target 408 of the CXL module 106 may operate or interface with the interconnect 202 in accordance one or more physical or logical protocols. For example, the interconnect 202 may be built in accordance with a Peripheral Component Interconnect Express (PCIe® or PCI-e®) standard. Applicable versions of the PCIe standard may include 1.x, 2.x, 3.x, 4.0, 5.0, 6.0, and future or alternative versions. In some cases, at least one other standard is layered over the physical-oriented PCIe standard. For example, the initiator 404 or the target 408 can communicate over the interconnect 202 in accordance with a CXL™ standard. Applicable versions of the CXL standard may include 1.x, 2.0, and future or alternative versions. The CXL standard may operate based on credits, such as read credits and write credits. In such implementations, the link controller 406 and the link controller 410 can be CXL controllers.

Figure 5:
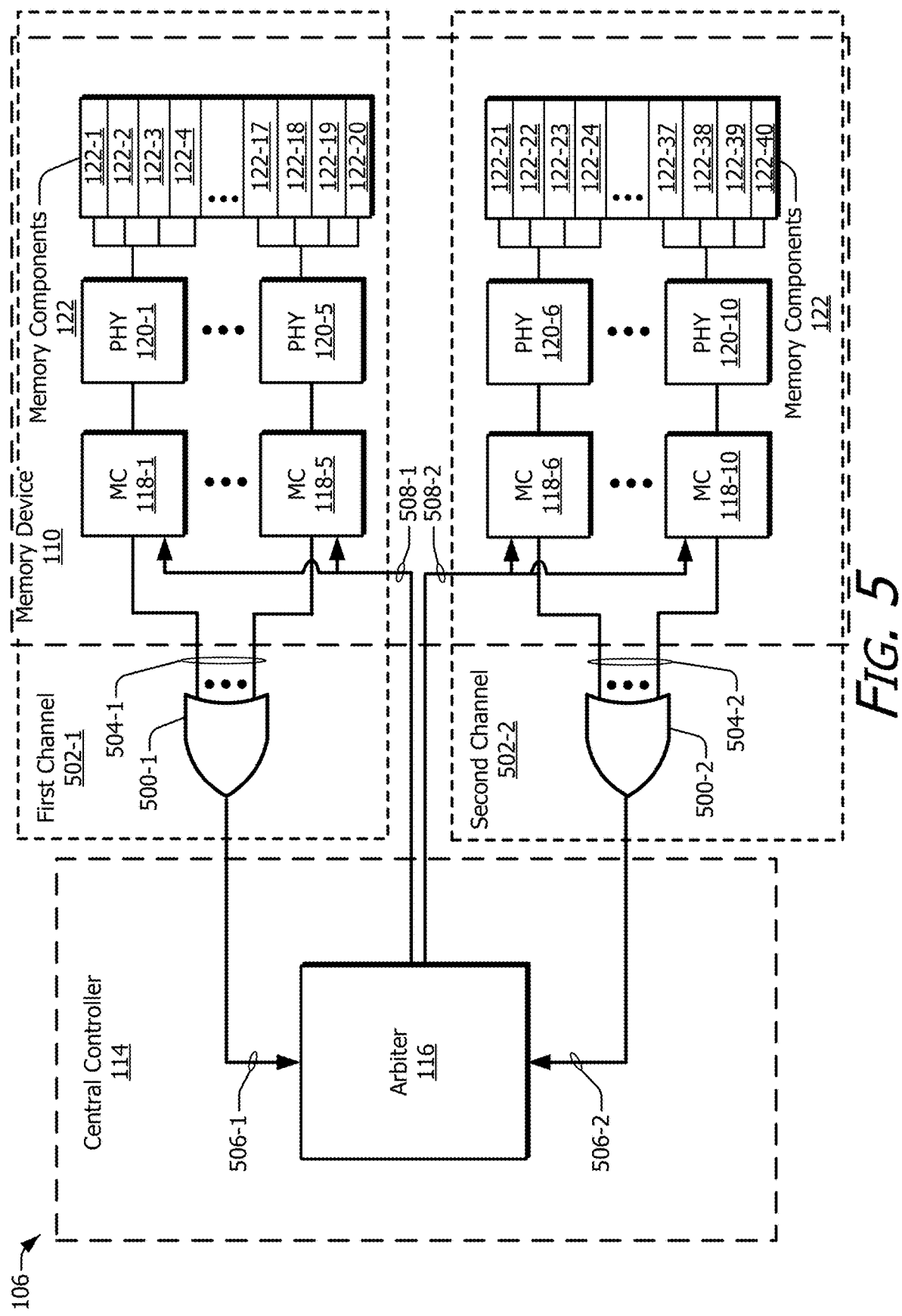
FIG. 5 illustrates an example of an apparatus that includes one or more memory devices, self-refresh management logic, and at least one arbiter to implement aspects of self-refresh arbitration.

FIG. 5 illustrates an example CXL module 106 that includes a central controller 114 having an arbiter 116 and logic 500, as well as the memory device 110 in accordance with some implementations. The central controller 114 may be implemented as a link controller (e.g., link controller 410). The CXL module 106 can be configured to include one or more channels 502 (e.g., low-power chip kill (LPCK) channels, data channels, memory channels). Although techniques are described herein with reference to a computing system implementing an architecture having one or more channels 502, the described techniques may be implemented within a computing system using a different architecture or logical arrangement.

Each channel 502 may include at least a portion of one or more memory devices (e.g., memory device 110), including multiple such memory devices. As illustrated, a first channel 502-1 and a second channel 502-2 can each include a portion of a memory device 110. The portions may include any number of memory components 122. As an example, the first channel 502-1 includes a portion of the memory device 110 having 20 memory components 122-1 to 122-20, while the second channel 502-2 includes another portion of the memory device 110 having 20 memory components 122-21 to 122-40. In total, 40 memory components 122 of the memory device 110 may be allocated between the two channels 502.

Although FIG. 5 illustrates only two channels 502, in other implementations, the CXL module 106 can be configured to include three or more channels. Further, each of the channels can include at least a portion of one or more memory devices. The portions may include any number of memory components 122. As an example, the CXL module 106 can be configured having three channels, where each of the three channels can include at least a portion of the memory device 110, and each of the portions can include 40 memory components 122. In such a configuration, 120 memory components 122 of at least one memory device 110 may be allocated between (including among) the three channels.

As shown in FIG. 5, the memory device 110 may include multiple memory controllers 118 (illustrated as MC 118). The first channel 502-1 and the second channel 502-2 can include a portion of the memory device 110 having one or more memory controllers 118. As an example, the first channel 502-1 includes a portion of the memory device 110 having five memory controllers 118 (e.g., MC 118-1 through MC 118-5), while the second channel 502-2 includes a portion of the memory device 110 having another five memory controllers 118 (e.g., MC 118-6 through MC 118-10). Memory controllers 118 may be operably coupled to one or more portions of the central controller 114 through an interconnect that is internal to the CXL module 106.

Each of the memory controllers 118 can be configured to control portions of one or more memory components 122 through at least one physical interface 120 (illustrated as a PHY circuit or chip 120 in FIG. 5). In an example, a memory controller 118-1 is operably coupled to four memory components 122-1 to 122-4 through a physical interface 120-1. The four memory components may be implemented with, for example, four DRAMs.

Each of the memory controllers 118, the physical interfaces 120, and the memory components 122 may be fabricated on at least one IC and packaged together or separately. The packaged ICs may be secured to or otherwise supported by the PCB or the CXL module 106 and may be directly or indirectly coupled to an interconnect. In some cases, the memory controllers 118 and the physical interfaces 120 may be integrated or packaged together, and the memory components 122 may be implemented on one or more separate IC chips. The components of the memory device 110 may, however, be fabricated, packaged, combined, and/or housed in other manners. Within the CXL module 106, the memory controllers 118, the physical interfaces 120, and/or the memory components 122 may be referred to as a "backend" component of the CXL module 106.

In an aspect, the memory controllers 118 controlling one or more memory components 122 includes commanding the memory components 122 to enter or exit a self-refresh mode so that the memory components 122 can perform self-refresh operations. The memory controllers 118 can contain logic configured to request (e.g., generate and transmit a signal to request) authorization from an arbiter 116 to command the memory components 122 to enter a self-refresh mode. While in a self-refresh mode, a memory component 122 can perform a self-refresh operation. Performing a self-refresh operation to refresh one or more memory arrays of the memory components 122 may involve one or more of (i) bank activation; (ii) reading information from an area of memory (e.g., a row or word line); and (iii) after the reading of the information, rewriting the information to the same area of memory without modification. Executing the self-refresh operation restores an electric charge of one or more capacitors within the memory cells of the memory components 122.

Further illustrated in FIG. 5, the central controller 114 includes logic 500. The CXL module 106 can include logic 500 for one or more channels (e.g., first channel 502-1, second channel 502-2). The logic 500 may include a first logical OR gate 500-1 operably coupled to one or more memory controllers 118 in the first channel 502-1 (e.g., MC 118-1 through MC 118-5) and a second logical OR gate 500-2 operably coupled to one or more memory controllers 118 in the second channel 502-2 (e.g., MC 118-6 through MC 118-10). In some implementations, the logical OR gate 500 or Boolean OR functionality generally can be realized using one or more other types of logical gates, such as a NAND gate and/or a NOR gate (e.g., three NAND gates can form a logical OR gate). The first logical OR gate 500-1 can be configured to receive one or more self-refresh request signals 504-1 from one or more memory controllers 118 in the first channel 502-1 and transmit a self-refresh request signal 506-1 (e.g., a unified or combined self-refresh request signal 506-1) to an arbiter 116. In such a configuration, if any of the memory controllers 118 included in the first channel 502-1 transmits an active or affirmative self-refresh request signal 504-1 to the first logical OR gate 500-1, then the first logical OR gate 500-1 can transmit an active or affirmative self-refresh request signal 506-1 to the arbiter 116. The second logical OR gate 500-2 can be configured to receive one or more self-refresh request signals 504-2 from one or more memory controllers 118 in the second channel 502-2 and transmit a self-refresh request signal 506-2 (e.g., a unified or combined self-refresh request signal 506-2) to the arbiter 116. In such a configuration, if any of the memory controllers 118 included in the second channel 502-2 transmits an active or affirmative self-refresh request signal 504-2 to the second logical OR gate 500-2, then the second logical OR gate 500-2 can transmit an active or affirmative self-refresh request signal 506-2 to the arbiter 116.

In additional implementations, if the CXL module 106 includes three or more channels, then the logic 500 can include three or more logical OR gates. Although FIG. 5 illustrates the logic 500 as including logical OR gates, it should be understood that the logic 500 may be implemented in any of a variety of manners, configurations, and/or using any combination of circuit components. In one example, the logic 500 may be implemented as firmware, instead of as hardware components. In another example, the logic 500 can be implemented using other logic gates, combinational logic circuits, transistors, and the like. Further, any number or combination of the described components can be combined, rearranged, and/or omitted and still implement the techniques described herein. For example, in some configurations, the logic 500 may be implemented as part of the central controller 114, including within the arbiter 116. In other configurations, the logic 500 may be implemented in a memory device (e.g., memory device 110) or a PCB of the CXL module 106.

This document now describes example operations executed between a central controller (e.g., central controller 114) and one or more memory devices (e.g., memory device 110) and managed by the arbiter 116 to control self-refresh operations. In aspects, the memory controllers 118 controlling memory components 122 via one or more physical interfaces 120 are configured to generate self-refresh request signals, including self-refresh request signal 504-1 and self-refresh request signal 504-2. The memory controllers generate the self-refresh request signals 504-1 and 504-2, in some implementations, at predetermined intervals. In alternative or additional implementations, the memory controllers can be configured to generate self-refresh request signals when a voltage value of a capacitor included in a memory component is below a threshold value. As an example, a memory controller 118-1, which can control four DRAM memory components 122-1 to 122-4 via a physical interface 120-1, can be configured to generate a respective self-refresh request signal 504-1 when a voltage value of a capacitor in any one of the four DRAM components is expected to be dropping toward a threshold value based on a timer. Additionally or alternatively, the memory controllers may determine to proactively place one or more memory components in a self-refresh mode to save power, perform signal training, and so forth.

The memory controllers 118 may be divided amongst one or more channels, including the first channel 502-1 and the second channel 502-2. Each channel 502 may include at least a portion of logic 500. For example, ten memory controllers can be divided amongst two channels such that five memory controllers are in a first channel (e.g., MC 118-1 through MC 118-5) and a remaining five memory controllers are in a second channel (e.g., MC 118-6 through MC 118-10). The memory controllers 118 within the first channel 502-1 may be operably coupled to the first logical OR gate 500-1, while the memory controllers 118 within the second channel 502-2 may be operably coupled to the second logical OR gate 500-2. As described herein, a portion of the logic 500 dedicated to a particular channel is referred to herein as associated logic circuitry with respect to the particular channel in this context.

The memory controllers 118 can further be configured to transmit self-refresh request signals as input values to associated logic circuitry. Thus, logic circuitry associated with a given channel can take as input self-refresh request signals transmitted by one or more memory controllers in the given channel. For example, the memory controller 118-1 can generate a self-refresh request signal 504-1. The memory controller 118-1 can then transmit the self-refresh request signal 504-1 as input to associated logic circuitry (e.g., the first logical OR gate 500-1).

Upon receiving a self-refresh request signal 504 from one or more memory controllers 118 included in a given channel 502, the associated logic circuitry can be configured to transmit the combined self-refresh request signal (e.g., the self-refresh request signal 506-1, the self-refresh request signal 506-2) to the arbiter 116. For example, the memory controller 118-1, which is included in the first channel 502-1, may transmit a self-refresh request signal 504-1 to the first logical OR gate 500-1. In response, the first logical OR gate 500-1 may then transmit the self-refresh request signal 506-1 to the arbiter 116 based on the self-refresh request signal 504-1 from the memory controller 118-1, as well as any another received self-refresh request signals 504-1.

The arbiter 116 can be configured to receive as input one or more self-refresh request signals from logic 500. The arbiter 116 can be implemented as an asynchronous arbiter, a round-robin arbiter, a priority arbiter, or any other type of arbiter. In aspects, the arbiter 116 may be configured to manage self-refresh operations to manage peak current draws. Upon receiving at least one self-refresh request signal 506, the arbiter 116 can be configured to generate and transmit at least one self-refresh enable signal (e.g., a self-refresh enable signal 508-1, a self-refresh enable signal 508-2) to one or more memory components 122 of at least one channel 502.

In some implementations, upon the arbiter 116 receiving a self-refresh request signal from logic circuitry associated with a given channel, the arbiter 116 can generate and transmit a self-refresh enable signal to each (e.g., up to all) of the memory controllers 118 within the given channel. For example, the arbiter 116 can receive a self-refresh request signal 506-1 from the first logical OR gate 500-1. In response, the arbiter 116 can generate and transmit a self-refresh enable signal 508-1 to each of the memory components 122 (e.g., the memory components 122-1 through memory components 122-20) in the first channel 502-1.

In other implementations, upon the arbiter 116 receiving a self-refresh request signal 506 from logic circuitry associated with a given channel 502, the arbiter 116 can generate and transmit a self-refresh enable signal 508 to two or more memory controllers 118 (but fewer than all the memory controllers) within the given channel 502. In some of such implementations, additional circuitry or logic may be included in the CXL module 106 that is configured to analyze a self-refresh enable signal 508 transmitted from the arbiter 116 and, based on the analysis, transmit the self-refresh enable signal 508 to selected memory controllers 118 (e.g., to a portion of such memory controllers on a rotating basis or to those memory controllers that transmitted an asserted self-refresh request signal 504). Alternatively, or additionally, the memory controllers 118 may include logic configured to enable the memory controllers 118 to analyze a self-refresh enable signal 508 transmitted from the arbiter 116 and, based on the analysis, selectively command one or more associated memory components 122 or refrain from issuing such command(s) based on whether the memory controller 118 has an active self-refresh request signal 504.

In still other implementations, upon the arbiter 116 receiving a self-refresh request signal 506 from logic circuitry (e.g., an OR gate 500) associated with a given channel 502, the arbiter 116 can generate and transmit a self-refresh enable signal 508 to one memory controller 118 within the given channel 502. In such implementations, the arbiter 116 can transmit a self-refresh enable signal to the memory controller 118 in the given channel that generated and transmitted the self-refresh request signal.

In yet other implementations, responsive to the arbiter 116 receiving at least one self-refresh request signal 506, the arbiter 116 can generate and transmit a self-refresh enable signal 508 to the memory controllers 118 within multiple (e.g., up to all) channels. For example, the arbiter 116 can receive a self-refresh request signal 506-1 from the first logical OR gate 500-1. The arbiter 116 can then generate and transmit at least one self-refresh enable signal 508 to each of the memory components 118 across the first and second (and other) channels 502-1 and 502-2.

In example implementations, the arbiter 116 can generate the self-refresh enable signals 508 using one or more schemes. For example, upon the arbiter 116 receiving a self-refresh request signal from logic circuitry associated with a given channel, the arbiter 116 can be configured to operate on a priority basis. On a priority basis, the arbiter 116 can generate and transmit a self-refresh enable signal to one or more memory controllers 118 of the channels based on priority. In such an implementation, the arbiter 116 may be implemented as a priority arbiter ("priority arbitration"). For example, a memory controller 118-1 in a first channel 502-1 can generate and transmit a first self-refresh request signal 504-1 through logic circuitry to the arbiter 116. After receiving the first self-refresh request signal 504-1, the arbiter 116 may receive a second self-refresh signal 504-2 originating from a memory controller 118-21 within a second channel 502-2. The arbiter 116 may be configured to generate and transmit a self-refresh enable signal to one or more memory controllers 118 in the second channel 502-2 firstly, and then to one or more memory controllers 118 in the first channel 502-1 secondly, based on the second channel 502-2 having a higher priority than the first channel 502-1. Thus, if multiple self-refresh request signals 504 are active, then the arbiter 116 can transmit a self-refresh enable signal (e.g., self-refresh enable signal 508-1) to the channel with the higher (including highest) priority even if a lower-priority channel also has an active self-refresh request signal (e.g., self-refresh request signal 506-2).

Further to the above descriptions, if the CXL module 106 includes two or more channels, upon an arbiter 116 receiving a self-refresh request signal from logic circuitry associated with a given channel, the arbiter 116 can be configured to operate in a round-robin manner ("round-robin arbitration"). With a round-robin scheme, the arbiter 116 can generate and transmit a self-refresh enable signal to one or more memory controllers of the channels in a defined sequential order. In such an implementation, the arbiter 116 may be implemented as a round-robin arbiter. For example, a CXL module 106 can include three channels. A memory controller in any of the three channels can generate and transmit a self-refresh request signal through logic circuitry to an arbiter 116. The arbiter 116 can then generate and transmit a self-refresh enable signal to: first, one or more memory controllers in a first channel; second, one or more memory controllers in a second channel; and third, one or more memory controllers in a third channel. Thus, if multiple self-refresh request signals 506 are active, the arbiter 116 can rotate through the channels receiving a self-refresh enable signal 508 in some predefined order in accordance with the round-robin scheme.

Further, upon an arbiter 116 receiving two or more self-refresh request signals from two or more channels within a predetermined duration (e.g., substantially simultaneously or with a time delta sufficiently small that the arbiter 116 cannot respond to a first self-refresh request signal before a second self-refresh request signal arrives), the arbiter 116 can be configured to operate in a round-robin manner, a biased round-robin manner, or a priority manner. For example, an arbiter 116 may receive two self-refresh request signals within a threshold duration such that a first self-refresh request signal from a second channel is received a few microseconds before a second self-refresh request signal from a first channel. The arbiter 116 operating in a round-robin manner is configured to generate and transmit a self-refresh enable signal, first, to one or more memory components in the first channel and, second, to one or more memory components in the second channel, assuming the designated round-robin order is first channel followed by second channel.

Figure 6:
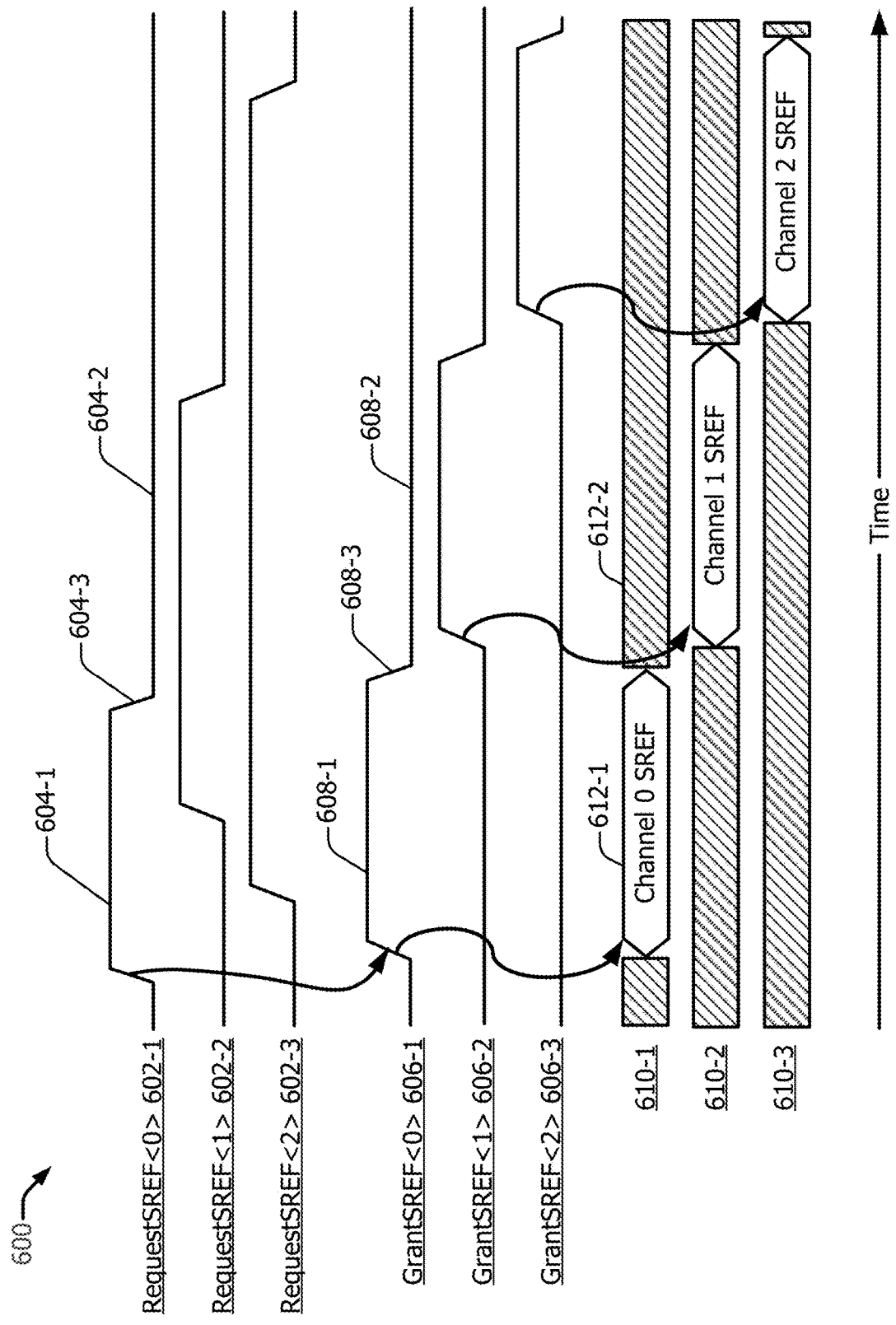
FIG. 6 is a timing diagram illustrating examples of self-refresh request signals and self-refresh enablement signals for implementations of self-refresh arbitration.

FIG. 6 illustrates an example timing diagram 600 for self-refresh authorization implemented by an arbiter 116 in accordance with some implementations. In portions of the description of FIG. 6, reference may be made also to the apparatus 102 of FIG. 1, the CXL module 106 of FIG. 5, and entities depicted therein as an example only. In implementations, the example timing diagram 600 illustrates a timing of self-refresh operations in a CXL module having three channels. Self-refresh request signals 602 illustrate three self-refresh request signals transmitted by three or more instances or parts of the logic 500 (e.g., transmitted by respective OR gates) associated with three channels. The three self-refresh request signals include self-refresh request signal 602-1, self-refresh request signal 602-2, and self-refresh request signal 602-3. The self-refresh request signals 602 can be in a high state 604-1, a low state 604-2, or a transition state 604-3 (indicated on self-refresh request signal 602-1 only for clarity). The self-refresh request signal 602 may be in a high state 604-1 when one or more memory controllers in a given channel requests to enter a self-refresh mode. The self-refresh request signal 602 may remain in a high state 604-1 until one or more memory components in a channel from whence the self-request signal 602 originated enters a self-refresh mode and/or performs a self-refresh operation.

A memory controller in the channel, operably coupled to the one or more memory components, may then end (e.g., terminate) a self-refresh mode by transmitting a self-refresh exit command to a volatile memory device, such as a memory component 122. As described herein, one or more memory controllers transmitting a self-refresh request signal can trigger a self-refresh request signal 602 to be in a high state 604-1 based on operation of the logic 500 (e.g., based on a logical OR operation). Conversely, the self-refresh request signal 602 may be in a low state 604-2 when no memory controllers are requesting to be in or to enter a self-refresh mode. The self-refresh request signal 602 may be in a transition state 604-3 when transitioning from a high state 604-1 to a low state 604-2, or from a low state 604-2 to a high state 604-1. Thus, the self-refresh request signal 602 can correspond to the self-refresh request signal 506 of FIG. 5, and the self-refresh enable signal 606 can correspond to the self-refresh enable signal 508 of FIG. 5.

In an example, an OR gate of a first channel may transmit a self-refresh request signal 602-1 based on signaling from one or more memory controllers in the first channel. As illustrated, the self-refresh request signal 602-1 is the first self-refresh request signal transmitted by an OR gate and received by an arbiter 116. Responsive to receiving the self-refresh request signal 602-1, the arbiter 116 transmits a self-refresh enable signal 606-1 to one or more memory controllers in the first channel. The self-refresh enable signals 606 can be in a high state 608-1, a low state 608-2, or a transition state 608-3 (illustrated on self-refresh enable signal 606-1 only for clarity). The self-refresh enable signal 606 may be in a high state 608-1 when the arbiter 116 grants one or more memory components authority to command at least one memory component to enter a self-refresh mode. As described herein, the arbiter 116 transmitting a self-refresh enable signal 606 to one or more memory controllers can correspond to a self-refresh enable signal 606 being in a high state 608-1. Conversely, the self-refresh enable signal 606 may be in a low state 608-2 when the arbiter 116 is not authorizing (e.g., is currently denying) the memory controllers to cause the memory components to entering a self-refresh mode. The self-refresh enable signal 606 may be in a transition state 608-3 when transitioning from a high state 608-1 to a low state 608-2, or from a low state 608-2 to a high state 608-1. In response to receiving the self-refresh enable signal 606-1, the one or more memory controllers in the first channel transmit a command to the associated memory components to cause them to enter a self-refresh mode, thereby maintaining data integrity of one or more memory components without a memory controller issuing auto-refresh commands.

Waveform 610 illustrates two modes of a memory array (e.g., at least one memory bank) associated with one or more memory components. The two modes can represent a self-refresh status of a volatile DRAM, including being in a self-refresh mode 612-1 and not being in a self-refresh mode 612-2 (as depicted on waveform 610-1 only for clarity). As illustrated, waveform 610-1 indicates a self-refresh mode 612-1 during substantially a same interval that the arbiter 116 grants the one or more memory controllers within the first channel authorization to command the memory components to enter the self-refresh mode by transmitting an asserted self-refresh enable signal 606-1.

Further, an OR gate of a second channel may transmit a self-refresh request signal 602-2 based on signaling from one or more memory controllers in the second channel. An OR gate of a third channel may transmit a self-refresh request signal 602-3 based on signaling from one or more memory controllers in the third channel. As illustrated, the self-refresh request signal 602-3 is transmitted by the OR gate of the third channel and received by the arbiter 116 before the self-refresh request signal 602-2 is transmitted by the OR gate of the second channel and received by the arbiter 116.

In implementations, the arbiter 116 may be implemented as a round-robin arbiter, such that the arbiter 116 can generate and transmit a self-refresh enable signal 606 to one or more memory controllers within channels in a defined sequential order. The defined sequential order may include the arbiter 116 transmitting self-refresh enable signals to one or more memory controllers in a first channel, a second channel, and then a third channel. The defined sequential order may be arbitrarily attributed to the channels. As an example, upon receiving the self-refresh request signals 602-1 to 602-3, the arbiter 116 generates and transmits: (i) the self-refresh enable signal 606-1 to one or more memory controllers in a first channel; (ii) the self-refresh enable signal 606-2 to one or more memory controllers in a second channel; and (iii) the self-refresh signal 606-3 to one or more memory controllers in a third channel.

In other implementations, responsive to the arbiter 116 receiving two self-refresh request signals from two channels that overlap within a threshold duration (e.g., self-refresh request signal 602-2 and self-refresh request signal 602-3), the arbiter 116 can be configured to operate based on priority. Thus, as illustrated, the arbiter 116 may be configured to prioritize the second channel more than the third channel responsive to a request being present on both channels. As a result, the arbiter 116 generates and transmits self-refresh enable signal 606-2 before generating and transmitting self-refresh enable signal 606-3. As illustrated, waveform 610-2 indicates a self-refresh mode 612-1 during the same interval that the arbiter 116 grants one or more memory controllers within the second channel authorization to command the second channel memory components to enter a self-refresh mode by transmitting a self-refresh enable signal 606-2. Waveform 610-3 indicates a self-refresh mode 612-1 during the same interval that the arbiter 116 grants one or more memory controllers within the third channel authorization to command the third channel memory components to enter a self-refresh mode and/or perform self-refresh operations by transmitting a self-refresh enable signal 606-3.

Although FIG. 6 illustrates a single self-refresh enable signal 606 being in a high state 608-1 when other self-refresh enable signals 606 are in a low state 608-2, in implementations, the arbiter 116 can generate and transmit two or more self-refresh enable signals 606 in a high state 608-1 concurrently or offset by any amount of time (e.g., a by instituting a delay).

Example Methods

Figure 8:
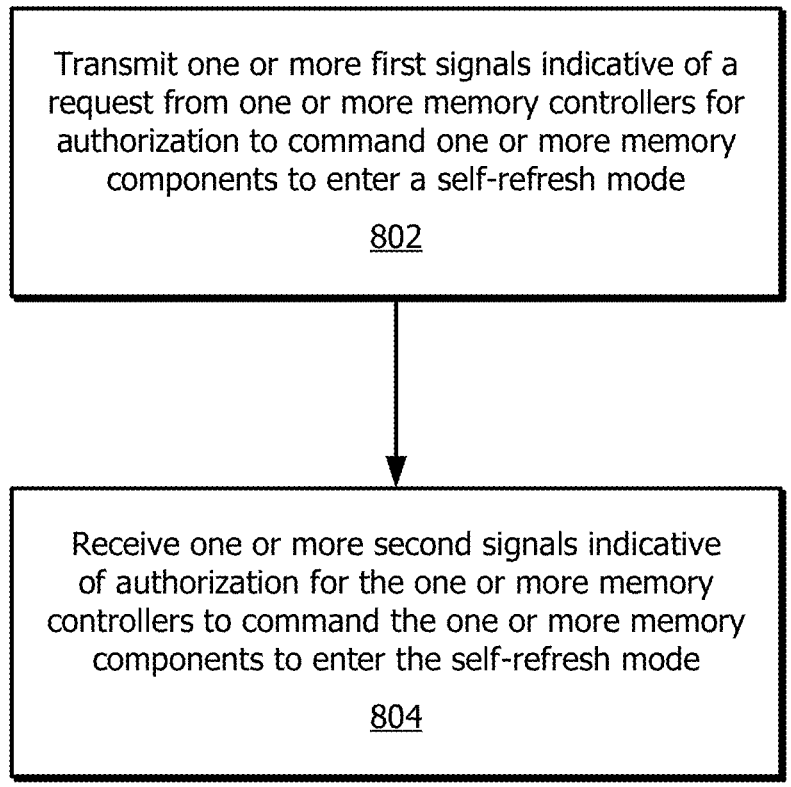
FIG. 8 is a flow diagram illustrating example processes for a memory controller in accordance with aspects of self-refresh arbitration.

This section describes example methods with reference to the flow diagrams of FIG. 7 and FIG. 8 for implementing self-refresh arbitration. These descriptions may also refer to components, entities, and other aspects depicted in FIGS. 1 through 6, which reference is made only by way of example.

FIG. 7 is a flow diagram illustrating example processes 700 for an arbiter in accordance with aspects of self-refresh arbitration. The flow diagram includes two blocks 702 and 704. At block 702, a control or management component receives a first signal indicative of a request from at least one memory controller for authorization to command at least one memory component to enter a self-refresh mode. For example, an arbiter 116 can receive a first signal (e.g., a self-refresh request signal 504 or 506) indicative of a request from at least one memory controller 118 for authorization to command at least one memory component 122 to enter a self-refresh mode 612-1. In some cases, the arbiter 116 may receive a unified or combined self-refresh request signal 506 from logic 500 (e.g., at least one OR gate) that produces the self-refresh request signal 506 from multiple self-refresh request signals 504 issued by multiple memory controllers 118. In other cases, the arbiter 116 may receive a self-refresh request signal 504 from at least one memory controller 118 without being modified or analyzed by logic 500.

At block 704, the control or management component transmits a second signal that authorizes the at least one memory controller to command the at least one memory component to enter the self-refresh mode based on the first signal. For example, the arbiter 116 can transmit, based on the first signal 504 or 506, a second signal (e.g., a self-refresh grant or enable signal 508) that authorizes the at least one memory controller 118 to command the at least one memory component 122 to enter the self-refresh mode 612-1. For instance, the arbiter 116 may assert the at least one self-refresh grant signal 508 that is coupled to multiple memory controllers 118 that are part of a same channel 502 based on multiple self-refresh request signals 506 respectively received from logic associated with multiple channels, including the same channel 502. Here, assertion of the self-refresh grant signal 508 enables the memory controllers 118 to send a command to the one or more memory components 122 to enter the self-refresh mode 612-1. The arbiter 116 may continue to assert the self-refresh grant signal 508 responsive to the self-refresh request signal 504 or 506 continuing to be asserted.

As an example, the arbiter may transmit a self-refresh enable signal by configuring the self-refresh enable signal to be in a high state until the memory components enter a self-refresh mode and perform one or more self-refresh operations. In an initial stage of a self-refresh operation, the memory components may activate memory banks, which can be a high-current task (e.g., power consuming task). Whereas, in a latter stage of the self-refresh operation, the memory components may not be performing tasks that demand as much power, such as bank activation. In such a scenario, and others, the arbiter may be configured to transmit one or more self-refresh enable signals to memory controllers in a defined sequential order with a delay between signal transmissions. For example, a first self-refresh enable signal may be in a high state enabling one or more memory controllers in a first channel to command memory components to enter a self-refresh mode and perform a self-refresh operation. The first self-refresh enable signal may still be in a high state when the arbiter asserts a second self-refresh enable signal, enabling one or more memory controllers in a second channel to command associated memory components to enter a self-refresh mode and perform a self-refresh operation. The arbiter may delay transmitting the second self-refresh signal relative to transmission of the first signal until electrically demanding tasks of the self-refresh operation in the first channel are completed.

In another example, the arbiter may be configured to transmit a first self-refresh enable signal to a first channel concurrently with a second self-refresh enable signal to a second channel. In still another example, the arbiter configures a self-refresh enable signal to remain in a high state until memory components in a given channel have completed self-refresh operations. In an alternative example, the arbiter configures a self-refresh enable signal to remain in a high state until memory controllers have commanded associated memory components to enter a self-refresh mode.

Using any of the techniques described herein, the arbiter can manage a timing of self-refresh operations. By managing which, how many, and in what order one or more memory controllers in at least two channels are authorized to command memory components to enter a self-refresh mode and perform self-refresh operations, the arbiter reduces peak power consumption, as well as voltage fluctuations. This facilitates memory input/output training and improves system performance and/or enables a less expensive power distribution network (PDN) to be deployed for a memory system.

FIG. 8 is a flow diagram illustrating example processes 800 for at least one memory controller in accordance with aspects of self-refresh arbitration. The flow diagram includes two blocks 802 and 804. At block 802, a memory system component transmits one or more first signals indicative of a request from one or more memory controllers for authorization to command one or more memory components to enter a self-refresh mode. For example, at least one memory controller 118 can transmit one or more first signals (e.g., a self-refresh request signal 504) indicative of a request from one or more memory controllers 118 for authorization to command one or more memory components 122 to enter a self-refresh mode 612-1. For instance, to facilitate input/output training performed between at least one physical interface 120 and at least one memory component 122, at least one memory controller 118 may transmit a self-refresh request signal 504 to an OR gate of logic 500 or "directly" to an arbiter 116.

Alternatively or additionally for block 802, logic 500, which can perform at least one logical OR operation, may transmit one or more first signals (e.g., a self-refresh request signal 506) indicative of a request from one or more memory controllers 118 for authorization to command one or more memory components 122 to enter a self-refresh mode 612-1. To do so, the logic 500 may receive multiple self-refresh request signals 504 from multiple memory controllers 118 and produce the self-refresh request signal 506 based on the multiple self-refresh request signals 504.

At block 804, the memory system component receives one or more second signals indicative of authorization for the one or more memory controllers to command the one or more memory components to enter the self-refresh mode. For example, the at least one memory controller 118 can receive one or more second signals (e.g., a self-refresh grant or enable signal 508) indicative of authorization for the one or more memory controllers 118 to command the one or more memory components 122 to enter the self-refresh mode 612-1. Thus, the at least one memory controller 118 may receive a self-refresh enable signal 508 from an arbiter 116. The arbiter 116 and the memory controller 118 may be part of a CXL module 106 that includes the memory components 122.

Responsive to receiving the one or more self-refresh enable signals, in an example, the one or more memory controllers in a given channel may configure their respective self-refresh request signals to be in an unasserted (e.g., low) state. In another example, responsive to memory components communicatively coupled to one or more memory controllers in a given channel completing self-refresh operations and/or exiting a self-refresh mode, the memory controllers may configure their respective self-refresh request signals to be in an unasserted state.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 through 6, the components of which may be further divided, combined, rearranged, and so on. The devices and components of these figures generally represent hardware, such as computing devices, packaged modules, IC chips, or circuits; firmware or the actions thereof; software; or a combination thereof. Thus, these figures illustrate some of the many possible systems or apparatuses capable of implementing the described methods.

Unless context dictates otherwise, use herein of the word OR may be considered use of an "inclusive or," or a term that permits inclusion or application of one or more items that are linked by the word OR (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although this document describes implementations for self-refresh arbitration in language specific to certain features or methods, the subject of the appended claims is not limited to the described features or methods. Instead, this document discloses the described features and methods as example implementations of self-refresh arbitration.

What is claimed is:

1. An apparatus comprising:
logic including multiple memory controllers configured to:
transmit, from one or more memory controllers of the multiple memory controllers, one or more self-refresh request signals indicative of a request for authorization to command one or more memory components to enter a self-refresh mode;
receive, at the one or more memory controllers, one or more self-refresh enable signals indicative of authorization for the one or more memory controllers to command the one or more memory components to enter the self-refresh mode; and
transmit, from the one or more memory controllers, one or more signals that command the one or more memory components to enter the self-refresh mode based on the one or more self-refresh enable signals.

2. The apparatus of claim 1, wherein:
the one or more memory controllers comprise multiple groups of memory controllers; and
each group of memory controllers of the multiple groups of memory controllers respectively corresponds to a channel of multiple channels.

3. The apparatus of claim 2, wherein:
at least one memory controller of a group of memory controllers of the multiple groups of memory controllers is configured to transmit at least one of the one or more self-refresh request signals indicative of a request to a logical OR gate that corresponds to the group of memory controllers.

4. The apparatus of claim 2, wherein:
at least one memory controller of a group of memory controllers of the multiple groups of memory controllers is configured to receive at least one of the one or more self-refresh enable signals indicative of authorization based on a respective channel of the multiple channels.

5. The apparatus of claim 2, wherein:
the one or more self-refresh enable signals comprise two or more self-refresh enable signals; and
two or more memory controllers of a group of memory controllers of the multiple groups of memory controllers are configured to receive two or more signals of the two or more self-refresh enable signals concurrently.

6. The apparatus of claim 1, wherein the one or more memory controllers are configured to:
transmit, from the one or more memory controllers, the one or more self-refresh request signals indicative of a request to a central controller configured to arbitrate authorization to command the one or more memory components to enter the self-refresh mode while at least one memory component of the apparatus is not commanded to enter the self-refresh mode.

7. A method comprising:
transmitting, from one or more memory controllers of multiple memory controllers, one or more self-refresh request signals indicative of a request for authorization to command one or more memory components to enter a self-refresh mode;
receiving, at the one or more memory controllers, one or more self-refresh enable signals indicative of authorization for the one or more memory controllers to command the one or more memory components to enter the self-refresh mode; and
transmitting, from the one or more memory controllers, one or more signals to command the one or more memory components to enter the self-refresh mode responsive to the receiving of the one or more self-refresh enable signals.

8. The method of claim 7, wherein:
the one or more memory controllers comprise multiple groups of memory controllers; and
each group of memory controllers of the multiple groups of memory controllers respectively corresponds to a channel of multiple channels.

9. The method of claim 8, further comprising:
transmitting, from at least one memory controller of a group of memory controllers of the multiple groups of memory controllers, at least one of the one or more self-refresh request signals indicative of a request to a logical OR gate that corresponds to the group of memory controllers.

10. The method of claim 9, further comprising:
receiving, at at least one memory controller of the group of memory controllers of the multiple groups of memory controllers, at least one of the one or more self-refresh enable signals indicative of authorization based on a respective channel of the multiple channels.

11. The method of claim 7, further comprising:
transmitting, from the one or more memory controllers, the one or more self-refresh request signals indicative of a request to an arbiter via at least one OR gate.

12. A system comprising:
logic including multiple memory controllers configured to:
transmit, from one or more memory controllers of the multiple memory controllers, one or more self-refresh request signals indicative of a request for authorization to command at least one memory component to enter a self-refresh mode;
receive, at the one or more memory controllers, one or more self-refresh enable signals indicative of authorization for the one or more memory controllers to command the least one memory component to enter the self-refresh mode; and
transmit, from the one or more memory controllers and responsive to receipt of the one or more self-refresh enable signals, one or more signals to command the at least one memory component to enter the self-refresh mode; and
circuitry including the at least one memory component configured to:
receive, at the at least one memory component, the one or more signals to command the at least one memory component to enter the self-refresh mode.

13. The system of claim 12, wherein:
the at least one memory component includes a first memory component and a second memory component;
the one or more memory controllers comprise two or more memory controllers;
the one or more self-refresh enable signals are indicative of authorizing a memory controller of the two or more memory controllers to command the first memory component to enter the self-refresh mode at a particular time; and
the one or more self-refresh enable signals are indicative of denying authorization to another memory controller of the two or more memory controllers to command the second memory component to enter the self-refresh mode at the particular time.

14. The system of claim 12, further comprising:
at least one logical OR gate configured to:
receive the one or more self-refresh request signals indicative of a request for authorization to command the at least one memory component to enter the self-refresh mode; and
transmit a fourth signal indicative of a request for authorization to command the at least one memory component to enter the self-refresh mode based on the one or more self-refresh request signals.

15. The system of claim 14, further comprising:
second logic including an arbiter configured to:
receive the fourth signal indicative of a request for authorization to command the at least one memory component to enter the self-refresh mode; and
transmit the one or more self-refresh enable signals indicative of authorization for the one or more memory controllers to command the at least one memory component to enter the self-refresh mode based on the fourth signal.

16. The system of claim 15, wherein:
the one or more memory controllers comprise multiple groups of memory controllers; and
each group of memory controllers of the multiple groups of memory controllers respectively corresponds to a channel of multiple channels.

17. The system of claim 16, wherein:
at least one memory controller of a group of memory controllers of the multiple groups of memory controllers is configured to transmit at least one of the one or more self-refresh request signals indicative of a request to a logical OR gate that corresponds to the group of memory controllers.

18. The system of claim 16, wherein:
the multiple groups of memory controllers comprise a group of memory controllers that includes two or more memory controllers;
the one or more self-refresh enable signals comprise two or more self-refresh enable signals; and
the two or more memory controllers of the group of memory controllers of the multiple groups of memory controllers are configured to receive at least two of the two or more self-refresh enable signals concurrently.

19. The system of claim 16, wherein:
the multiple groups of memory controllers comprise a group of memory controllers that includes two or more memory controllers; and
the two or more memory controllers of the group of memory controllers of the multiple groups of memory controllers are each operatively coupled to multiple memory components.

20. The system of claim 19, wherein:
the one or more signals to command the at least one memory component to enter the self-refresh mode comprise two or more signals to command the at least one memory component to enter the self-refresh mode; and
at least one memory controller of the two or more memory controllers of the group of memory controllers is configured to transmit the two or more signals concurrently.

* * * * *